United States Patent
Chung et al.

(10) Patent No.: US 7,847,416 B2
(45) Date of Patent: Dec. 7, 2010

(54) WAFER LEVEL PACKAGE AND METHOD OF FABRICATING THE SAME

(75) Inventors: Hyun-Soo Chung, Gyeonggi-do (KR); In-Young Lee, Gyeonggi-do (KR); Son-Kwan Hwang, Gyeonggi-do (KR); Dong-Ho Lee, Gyeonggi-do (KR); Seong-Deok Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/498,913

(22) Filed: Jul. 7, 2009

(65) Prior Publication Data

US 2009/0267211 A1 Oct. 29, 2009

Related U.S. Application Data

(62) Division of application No. 11/752,219, filed on May 22, 2007, now abandoned.

(30) Foreign Application Priority Data

May 22, 2006 (KR) .............................. 2006-45802

(51) Int. Cl.
*H01L 23/48* (2006.01)
*H01L 23/52* (2006.01)
*H01L 29/40* (2006.01)

(52) U.S. Cl. ................ 257/777; 257/774; 257/E23.168
(58) Field of Classification Search ................ 257/777, 257/778, 774, E23.168
See application file for complete search history.

(56) References Cited

U.S. PATENT DOCUMENTS

| 4,807,021 A * | 2/1989 | Okumura ..................... 257/777 |
| 6,838,744 B2 | 1/2005 | Takahashi et al. |
| 6,908,856 B2 * | 6/2005 | Beyne et al. ................. 438/667 |
| 2001/0007373 A1 | 7/2001 | Kadota et al. |
| 2001/0018233 A1 | 8/2001 | Haji et al. |

(Continued)

FOREIGN PATENT DOCUMENTS

KR  10-2001-0018694  3/2001

(Continued)

OTHER PUBLICATIONS

English language abstract of Korean Publication No. 10-2001-0018694.

(Continued)

*Primary Examiner*—David A Zarneke
*Assistant Examiner*—Jenny L Wagner
(74) *Attorney, Agent, or Firm*—Myers Bigel Sibley & Sajovec, PA

(57) ABSTRACT

Wafer level packages and methods of fabricating the same are provided. In one embodiment, one of the methods comprises forming semiconductor chips having a connection pad on a wafer, patterning a bottom surface of the wafer to form a trench under the connection pad, patterning a bottom surface of the trench to form a via hole exposing the bottom surface of the connection pad, and forming a connecting device connected to the connection pad through the via hole. The invention provides a wafer level package having reduced thickness, lower fabrication costs, and increased reliability compared to conventional packages.

9 Claims, 16 Drawing Sheets

U.S. PATENT DOCUMENTS

| | | |
|---|---|---|
| 2001/0045668 A1 | 11/2001 | Liou et al. |
| 2002/0132461 A1 | 9/2002 | Kizaki |
| 2003/0232486 A1 | 12/2003 | Mashino |
| 2006/0019467 A1 | 1/2006 | Lee et al. |

FOREIGN PATENT DOCUMENTS

| | | |
|---|---|---|
| KR | 10-2002-0012061 | 2/2002 |
| KR | 10-2002-0082294 | 10/2002 |
| KR | 10-2005-0021078 | 3/2005 |
| KR | 10-2006-0010099 | 2/2006 |

OTHER PUBLICATIONS

English language abstract of Korean Publication No. 10-2002-0012061.

English language abstract of Korean Publication No. 10-2002-0082294.

English language abstract of Korean Publication No. 10-2005-0021078.

English language abstract of Korean Publication No. 10-2006-0010099.

* cited by examiner

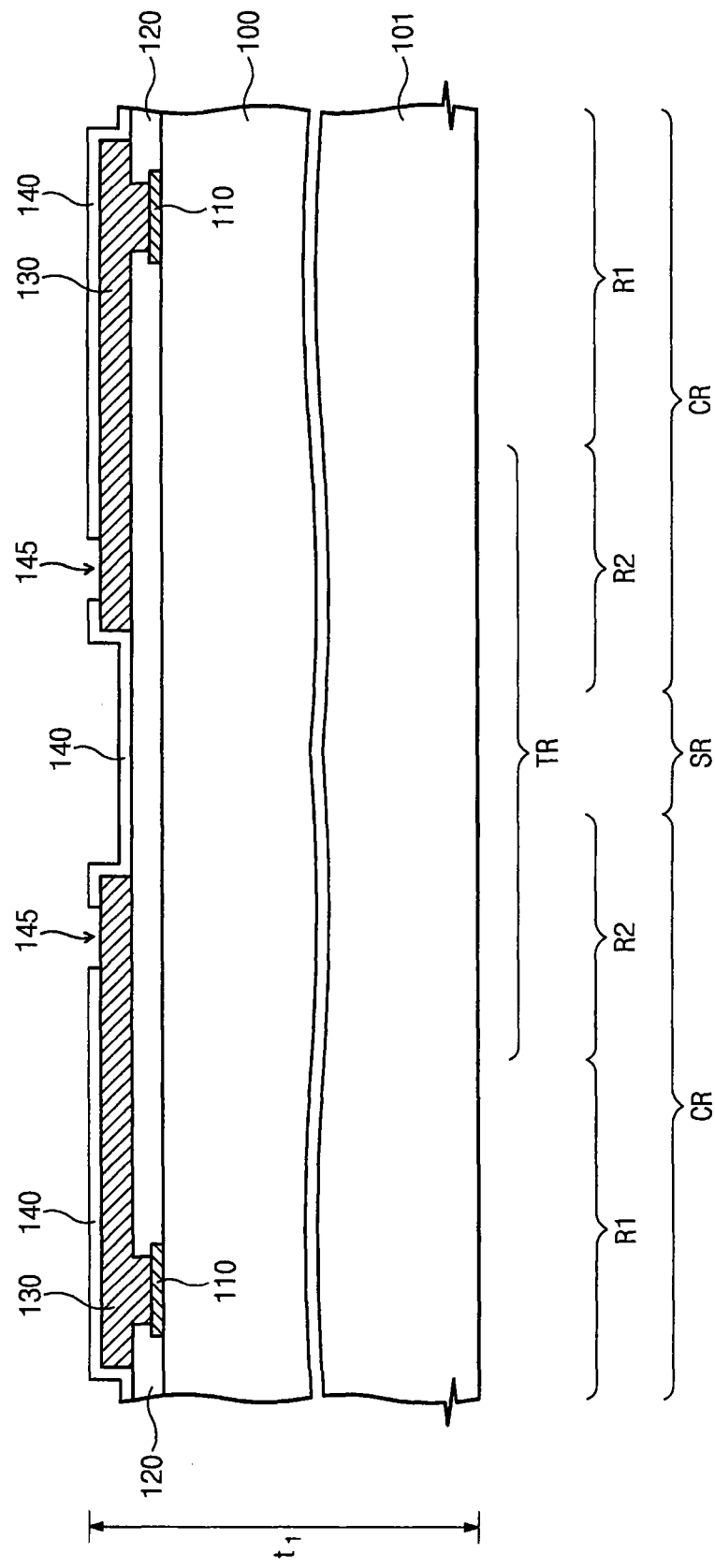

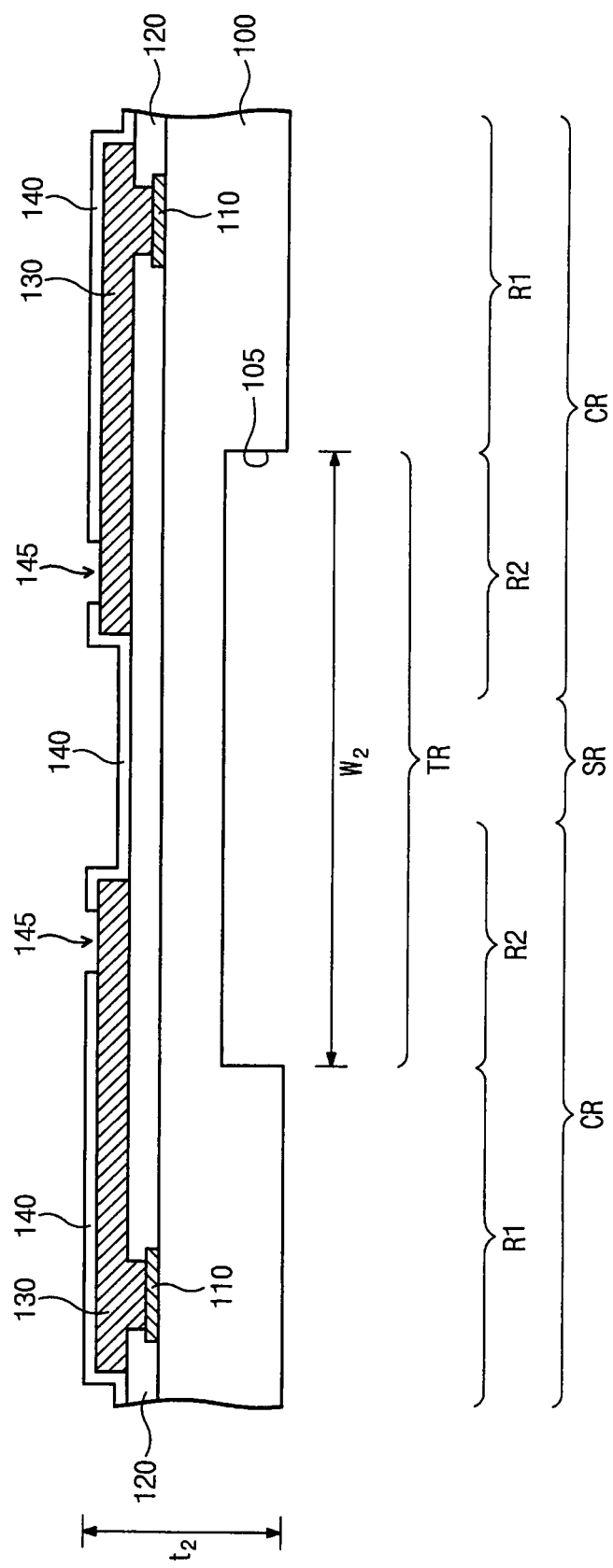

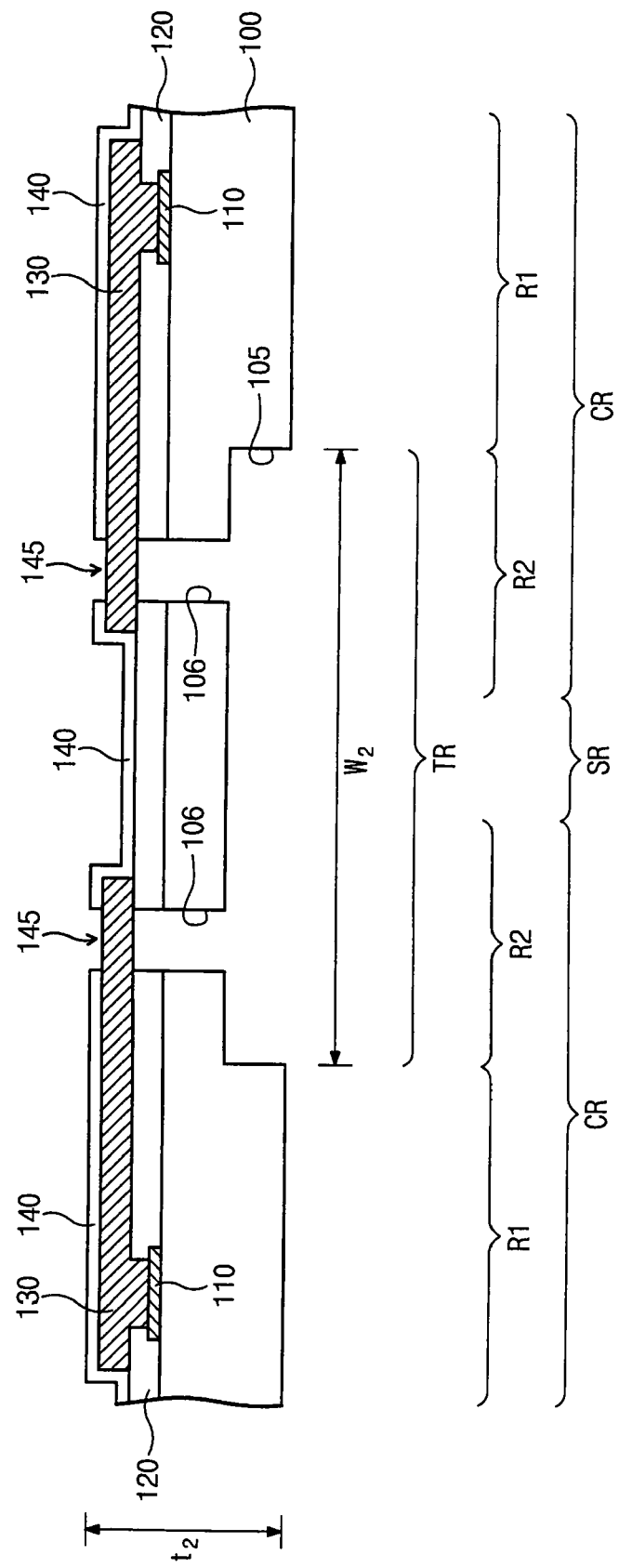

WAFER LEVEL PACKAGE AND METHOD OF FABRICATING THE SAME

CROSS-REFERENCE TO RELATED APPLICATIONS

This application is a Divisional of U.S. Ser. No. 11/752,219, filed on May 22, 2007, now is pending, which claims priority from Korean Patent Application No. 2006-45802, filed on May 22, 2006, all of which are hereby incorporated by reference in their entirety.

BACKGROUND

1. Technical Field

The present invention relates to a semiconductor package and a method of fabricating the same. More specifically, the present invention is directed to a wafer level package and a method of fabricating the same.

2. Background of the Related Art

Generally, semiconductor manufacturing can be divided into two kinds of processes. The two kinds of processes are a front-end process to manufacture IC chips on a wafer by means of processes such as photolithography/deposition/etch, and a back-end process involving assembling and packaging each of the IC chips. Four significant functions of the packaging process are as follows:

1. Protection of the IC chips from the environment and handling damage.
2. Completing interconnections to carry electrical signals into and out of the IC chip.
3. Providing physical support for the IC chip.
4. Heat dissipation.

In addition to the above explained functions, as semiconductor devices continue to be scaled down and as portable electronic devices are becoming popular, several additional functions, such as the enhancement of electrical performance and reductions in cost, weight and thickness, are being required from the packaging process. Recently in order to satisfy this technological demand, methods of using an interconnection structure which penetrates semiconductor chips to electrically connect the semiconductor chips have been proposed.

FIG. 1 is a cross-sectional view of a conventional stack-type package.

Referring to FIG. 1, a plurality of package units 60 are stacked sequentially on an interconnection substrate 20 having a connection terminal 22 and a bump 24 coupled to the connection terminal 22. Each of the package units 60 includes a semiconductor chip 10 having input/output pads 12 and an interconnection structure penetrating the semiconductor chip 10 to be connected to the input/output pads 12.

More specifically, the interconnection structure includes a bottom conductive pattern 30 which is connected to the input/output pad 12 and covers an inside wall of a via hole 11 penetrating the semiconductor chip 10, a plug pattern 40 filling the via hole 11 having the bottom conductive pattern 30, and an under-bump metallization (UBM) pattern 50 disposed on the plug pattern 40. Here, the plug pattern 40 may be divided into a plug part 44 filling the via hole 11, a connecting part 46 which is disposed on the plug part 44 to be extended to a top surface of the input/output pad 12, and a protruding part 42 which is disposed under the plug part 44 to protrude from a bottom surface of the semiconductor chip 10. The protruding part 42 and the plug part 44 may be formed by the same process or by separate fabricating processes.

According to the above explained conventional art, the package units 60 and the interconnection substrate 20 are electrically connected through the interconnection structure. More specifically, the protruding part 42 of one package unit is electrically connected to the UBM pattern 50 of another package unit or the connection terminal 22 of the interconnection substrate 20. Since the conventional wire bonding process can be minimized or eliminated by the afore-mentioned connecting method, this package technology using the plug structure is especially desirable in application fields in which a high performance and a small form-factor are required.

However, according to conventional art, in order to construct the via hole 11 and an interconnection structure penetrating the via hole 11, a complicated fabricating process is required which may increase the fabricating costs and increase the number of defective products. In addition, in order to secure stability of the electrical connections, a solder bump may be formed at a bottom surface of the package units 60. (For example, the protruding part 42 may be substituted with a solder bump). However, contrary to the technical trend toward a small thickness in the packaging art, this method results in an increase of the space h1 between the package units 60 and an increase of the space h2 between the package unit 60 and the interconnection substrate 20. Also, in the conventional packaging scheme, a break of the protruding part 42 may often occur because a mechanical force may be focused on the protruding part 42 during the process for adhering semiconductor chips.

The present invention addresses these and other disadvantages of the conventional art.

SUMMARY

Exemplary embodiments of the present invention are directed to a wafer level package and method of fabricating the same. In an exemplary embodiment, the method may include fabricating a wafer level package comprising: forming semiconductor chips having a connection pad on a wafer; patterning a bottom surface of the wafer to form a trench under the connection pad; patterning a bottom surface of the trench to form a via hole exposing a bottom surface of the connection pad; and forming a connecting device connected to the connection pad through the via hole.

In another exemplary embodiment, the device may include a wafer level package having semiconductor chips stacked on an interconnection substrate, wherein the wafer level package comprises: the semiconductor chip comprising a central region for an internal circuit and a connection region disposed around the central region; a redistribution structure connected to the internal circuit on the semiconductor chip, the redistribution structure comprising a connection pad formed on the connection region; and a connecting device in the connection region, the connecting device penetrating through the semiconductor chip to be connected to the connection pad, wherein the thickness of the connection region is smaller than that of the central region.

Embodiments of the present invention provide a wafer level package with reduced fabrication costs, lower overall package thickness, and improved reliability as compared to the conventional art.

BRIEF DESCRIPTION OF THE DRAWINGS

FIGS. 3A to 7A, FIG. 8 and FIG. 9 are cross-sectional views illustrating a method of fabricating a wafer level package according to an embodiment of the present invention.

FIGS. 3B to 7B are perspective views illustrating a method of fabricating a wafer level package according to an embodiment of the present invention.

DETAILED DESCRIPTION

Figure 1:
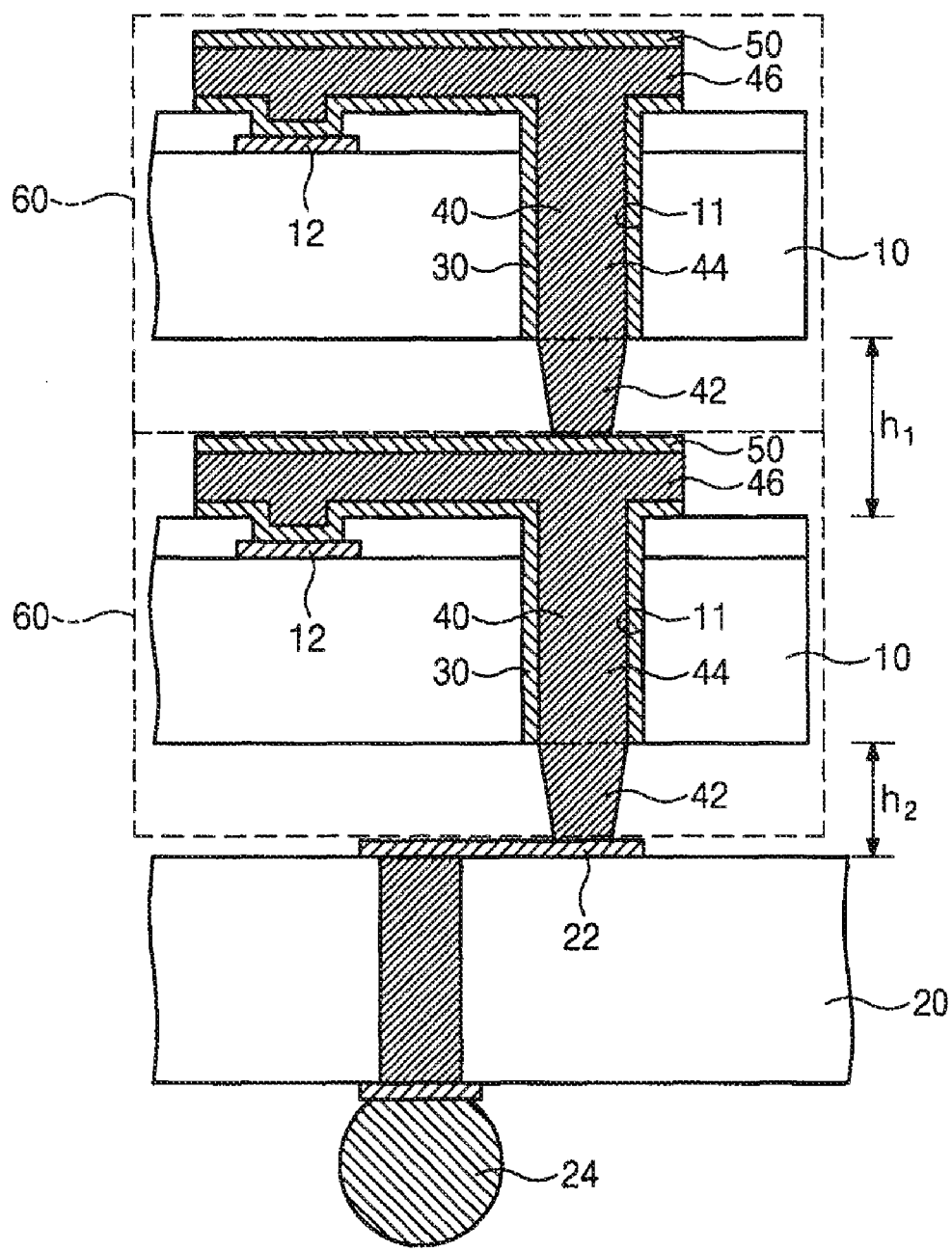
FIG. 1 is a cross-sectional view of a conventional stack-type package.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numbers refer to like elements throughout.

Figure 2A:
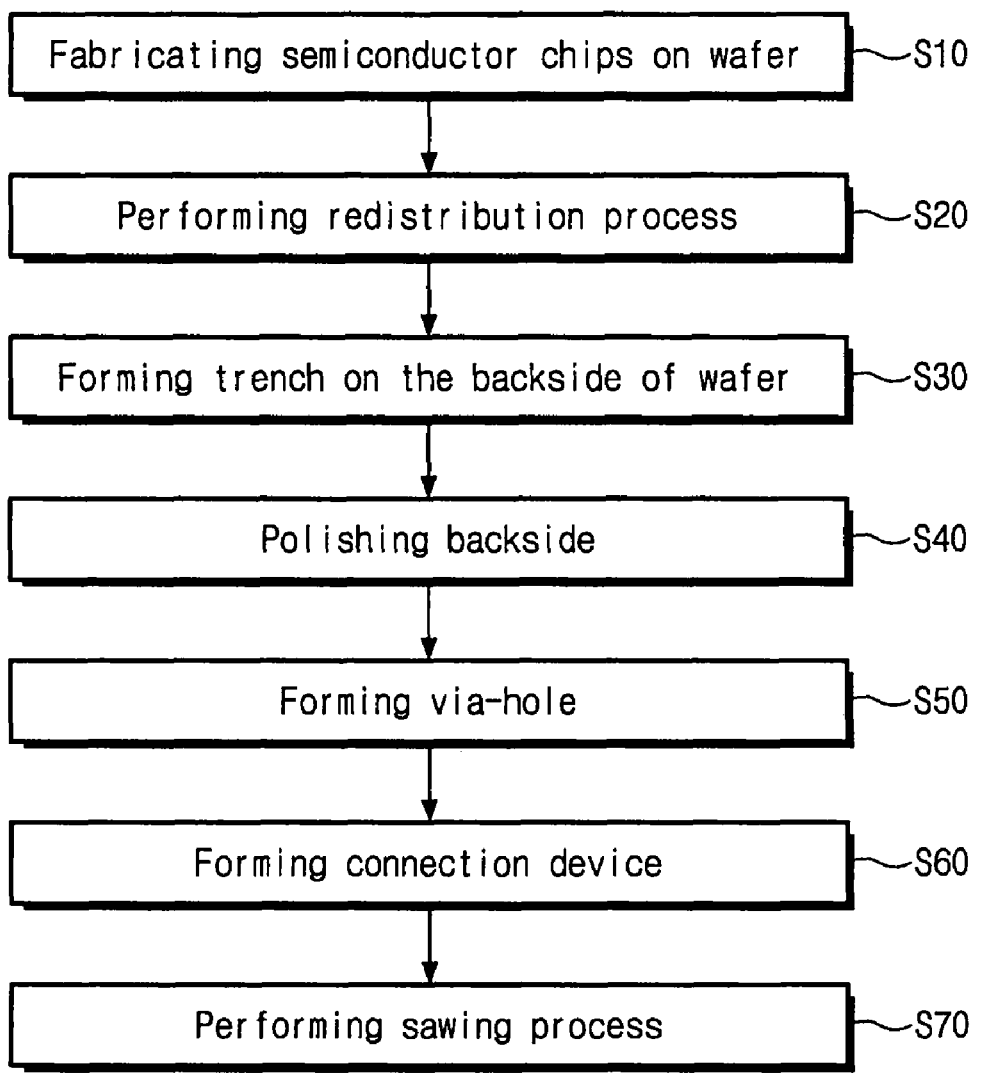
FIG. 2A and FIG. 2B are process flow charts to describe a method of fabricating a wafer level package according to exemplary embodiments of the present invention.

FIG. 2A is a process flow chart of a method of fabricating a wafer level package according to exemplary embodiments of the present invention. FIGS. 3A to 7A, FIG. 8 and FIG. 9 are cross-sectional views of a method of fabricating a wafer level package according to some embodiments. Also, FIGS. 3B to 7B are perspective views of a method of fabricating a wafer level package according to some embodiments.

Figure 3B:
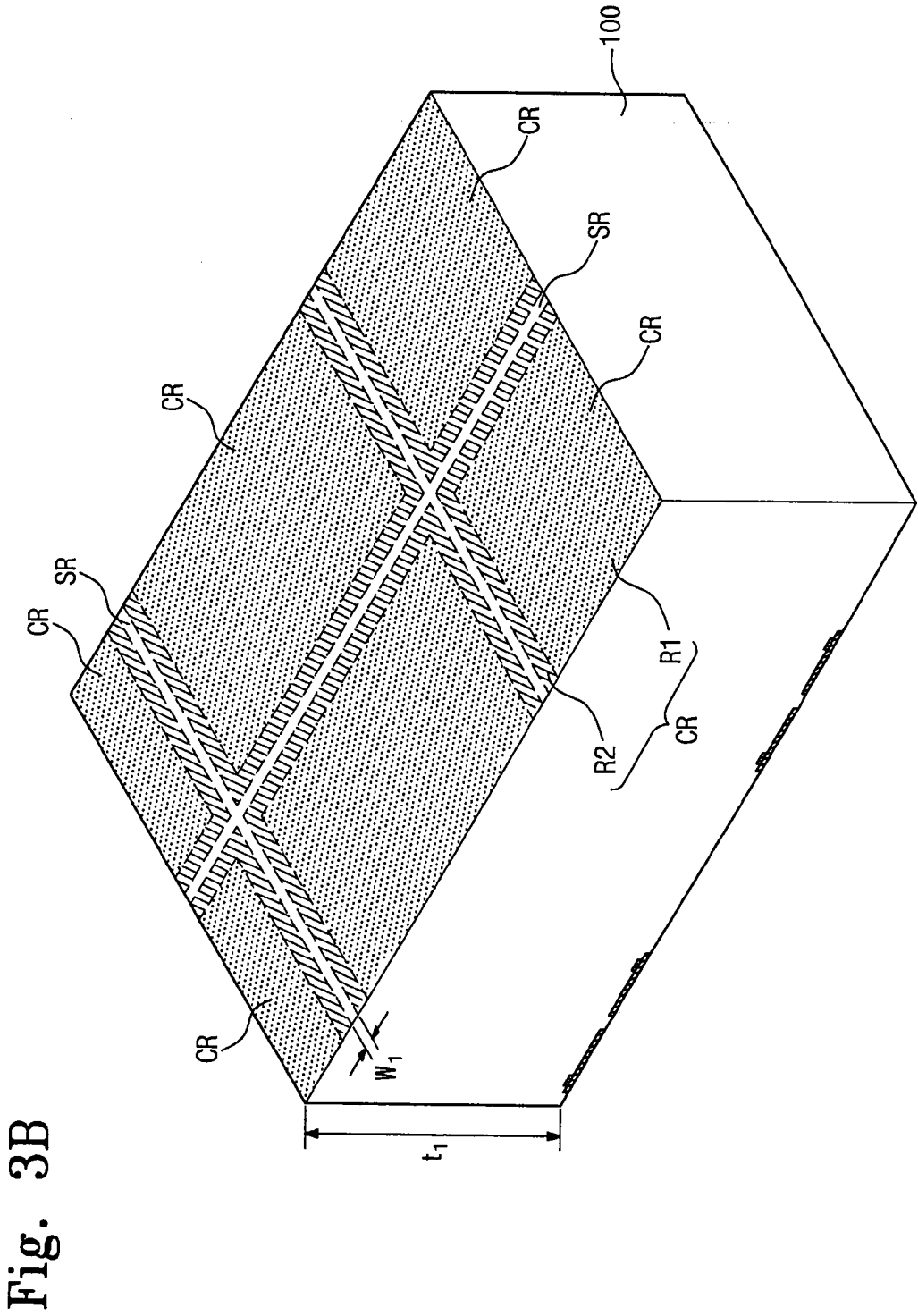

Referring to FIG. 2A, FIG. 3A and FIG. 3B, semiconductor chips are formed on a wafer 100 (S10). The wafer 100 includes chip regions CR where the semiconductor chips are formed and a scribe lane region SR disposed between the chip regions CR. Each of the semiconductor chips are separated from the wafer by a subsequent sawing process S70, which is performed along the scribe lane region SR. Each of the semiconductor chips has an internal circuit (not illustrated) and input/output pads 110 connected to the internal circuits. The internal circuit includes microelectronic devices (not shown) and the semiconductor chips also include an interconnection structure (not shown) connecting the microelectronic devices to the input/output pads 110. In addition, a protection layer pattern 120 exposing the input/output pad 110 may be disposed on the wafer 100.

Subsequently, a redistribution structure 130 is formed on the resultant structure where the input/output pads 110 are formed by means of a redistribution process (S20). The redistribution structure 130 is extended across the top of the chip region CR and is connected to the input/output pad 110. An insulation layer 140 may be disposed on the redistribution structure 130. The insulation layer 140 has openings 145 which are formed over the chip region CR to expose top surfaces of the redistribution structure 130. The insulation layer 140 may be made of adhesive material. A region of the redistribution structure 130 exposed by the openings 145 is used as a connecting pad for electrical connection with other semiconductor chips.

The process of forming a redistribution structure 130 may include forming a mold layer which has a mold opening defining a shape of the redistribution structure 130 on the wafer with the input/output pad 110 and filling the mold opening with a metal layer which is formed by using an electroplating method. According to an exemplary embodiment of the present invention, before forming the metal layer, forming a seed layer used as a seed electrode during the electroplating process may further be included. The thickness of the mold layer (the thickness of the redistribution structure 130, in essence) may be in a range of about 1 to 50 micrometers, and more desirably between about 2 to 10 micrometers. However, the method of fabricating the redistribution structure 130 is not limited to the specific method described above and may be fabricated using other known methods.

Figure 4A:
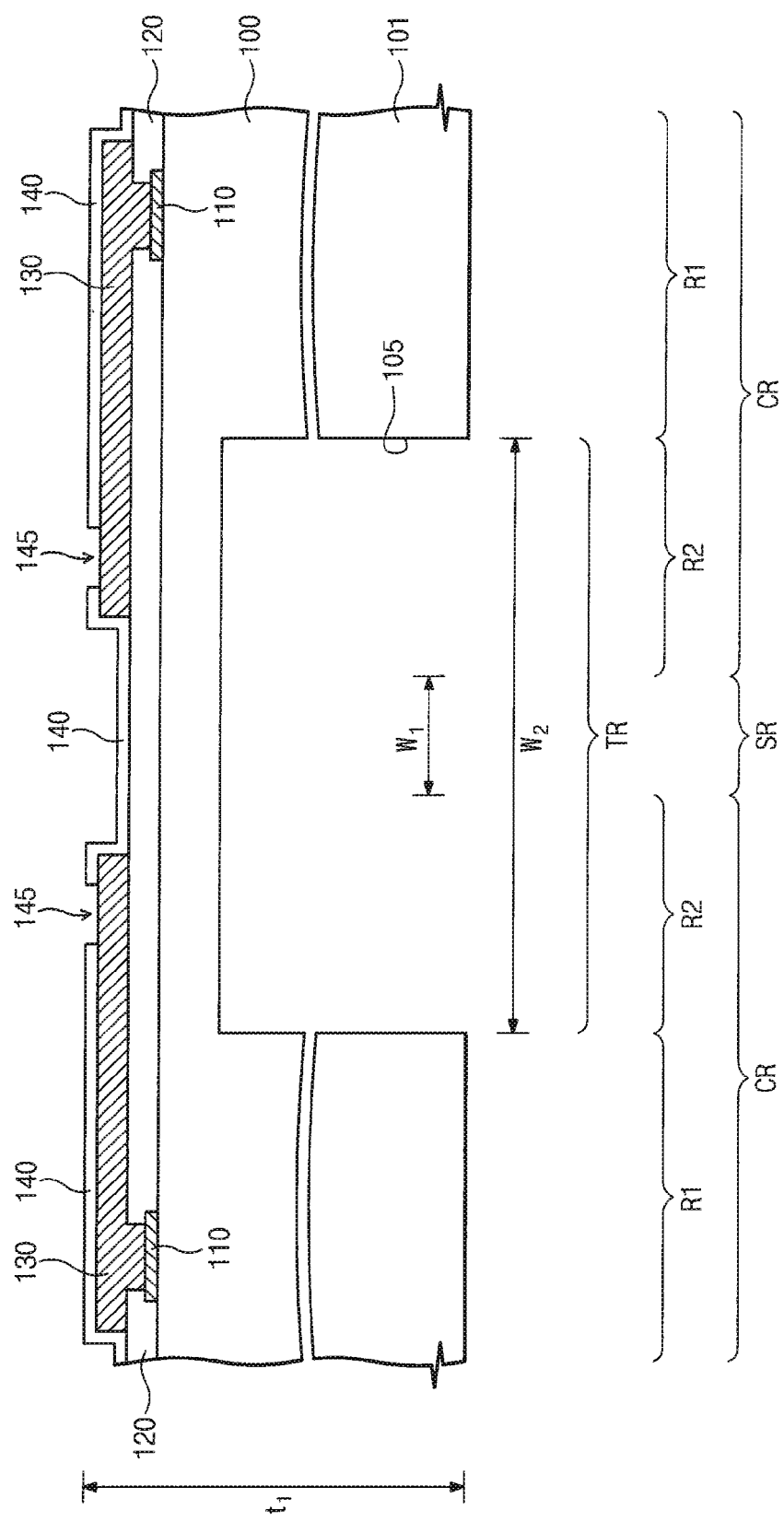
Figure 4B:
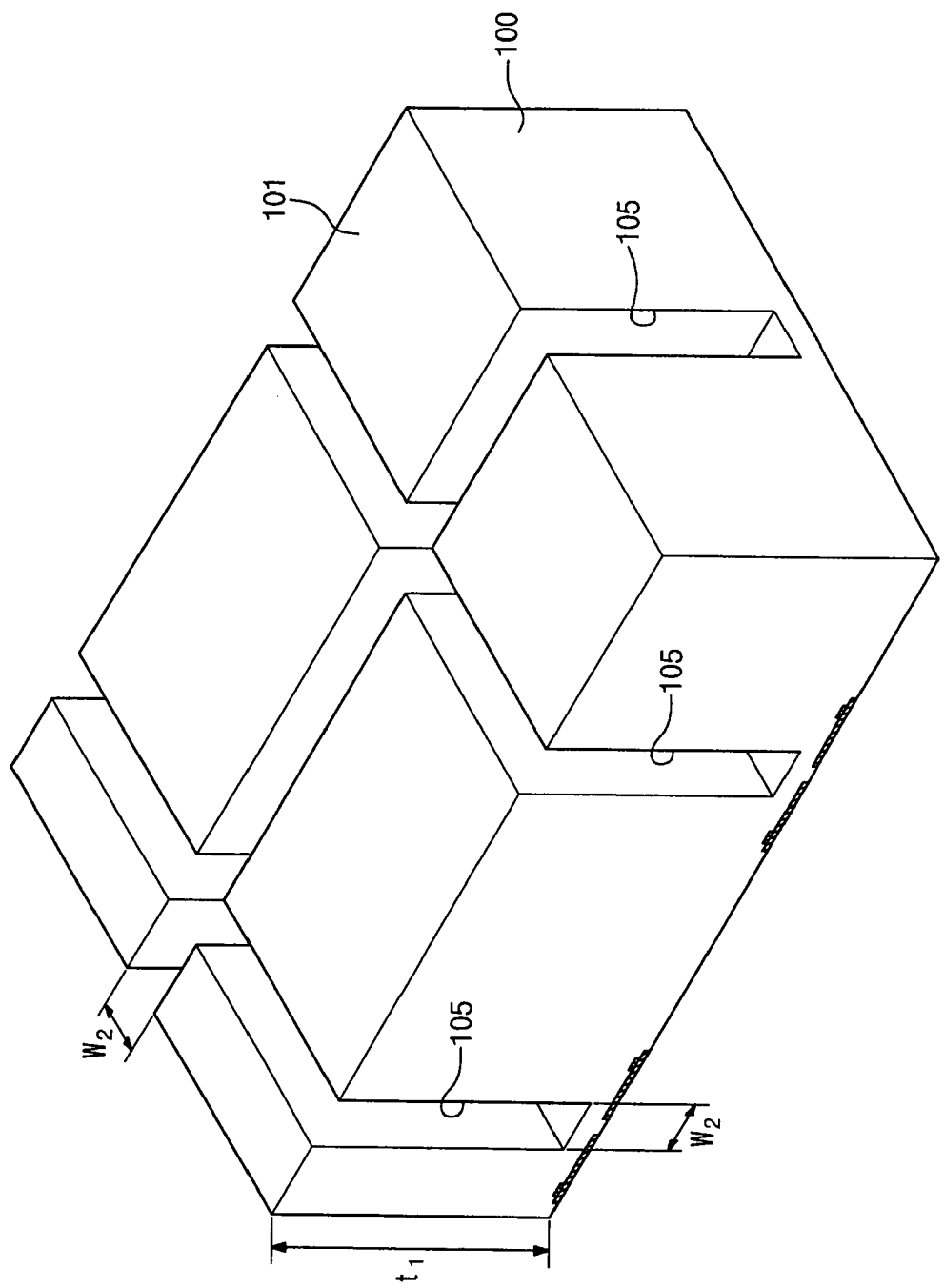

Referring to FIG. 2A, FIG. 4A and FIG. 4B, a trench 105 having a smaller thickness than the wafer 100 is formed on the back side 101 of the wafer where the redistribution structure 130 (S30) is formed. The trench 105 is formed along the scribe lane region SR, and a width $W_2$ of the trench 105 is formed larger than a width $W_1$ of the scribe lane region SR. In detail, the chip region CR may be separated into a central region R1 where the internal circuits are disposed, and a connection region R2 disposed around the central region R1. The trench 105 is formed at the scribe lane region SR and the connection region R2.

The depth of the trench 105 is a process variable which decides the length of via holes that are subsequently formed. According to an exemplary embodiment, the method of forming the trench 105 includes patterning the back side of the wafer 100 until the thickness of the wafer 100 in the trench regions is in a range of about 1 to 50 micrometers. The patterning is done at the scribe lane region SR and the connection regions R2. The patterning to form the trench 105 may be performed by using a physical method such as a sawing process. In other words, a sawing process may be used to partially saw through the wafer 100, thereby forming the trench 105. In this method, the depth of the saw blade in the wafer 100 during the sawing process will determine the depth of the trench 105 and the thickness of the wafer 100 remaining in the trench regions. Commonly used patterning methods comprising photolithography and etch processes may also be used.

Figure 5B:
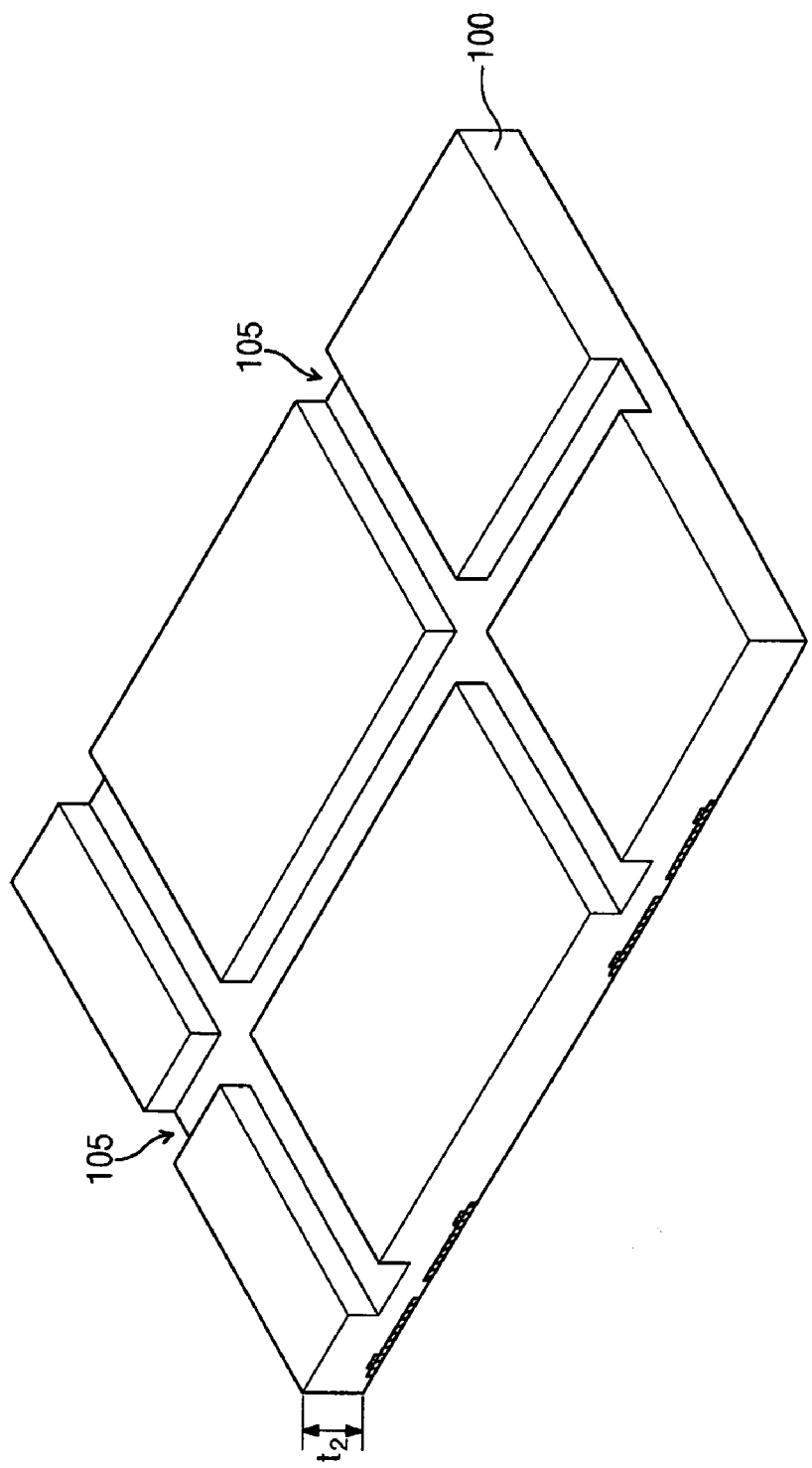

Referring to FIG. 2A, FIG. 5A and FIG. 5B, the back side of the wafer 100 with the trench 105 is polished (S40). The thickness of the wafer 100 decreases so that thickness of the resulting structure comprising the redistribution structure 130 becomes $t_2$ which is smaller than the initial thickness $t_1$. According to the present invention, the resulting thickness $t_2$ may be between approximately tens of micrometers and millimeters.

According to an exemplary embodiment of the present invention, in order to prevent the trench 105 from changing its shape, the back side-polishing process may further include forming a sacrificial layer(not illustrated) filling the trench 105. The sacrificial layer may be made of material having etch selectivity to the wafer 100. Also, the back-side polishing process may include forming a supporting layer (not illustrated) on the wafer 100. This is done in order to prevent damage to the redistribution structure 130 and the semiconductor chip due to mechanical force during the back side-polishing process. The supporting layer may be made of material which is removable by exposing the material to heat or ultraviolet radiation. Also, the supporting layer may be made of material having essentially the same thermal expansion coefficient as a wafer with semiconductor chips.

Figure 6B:
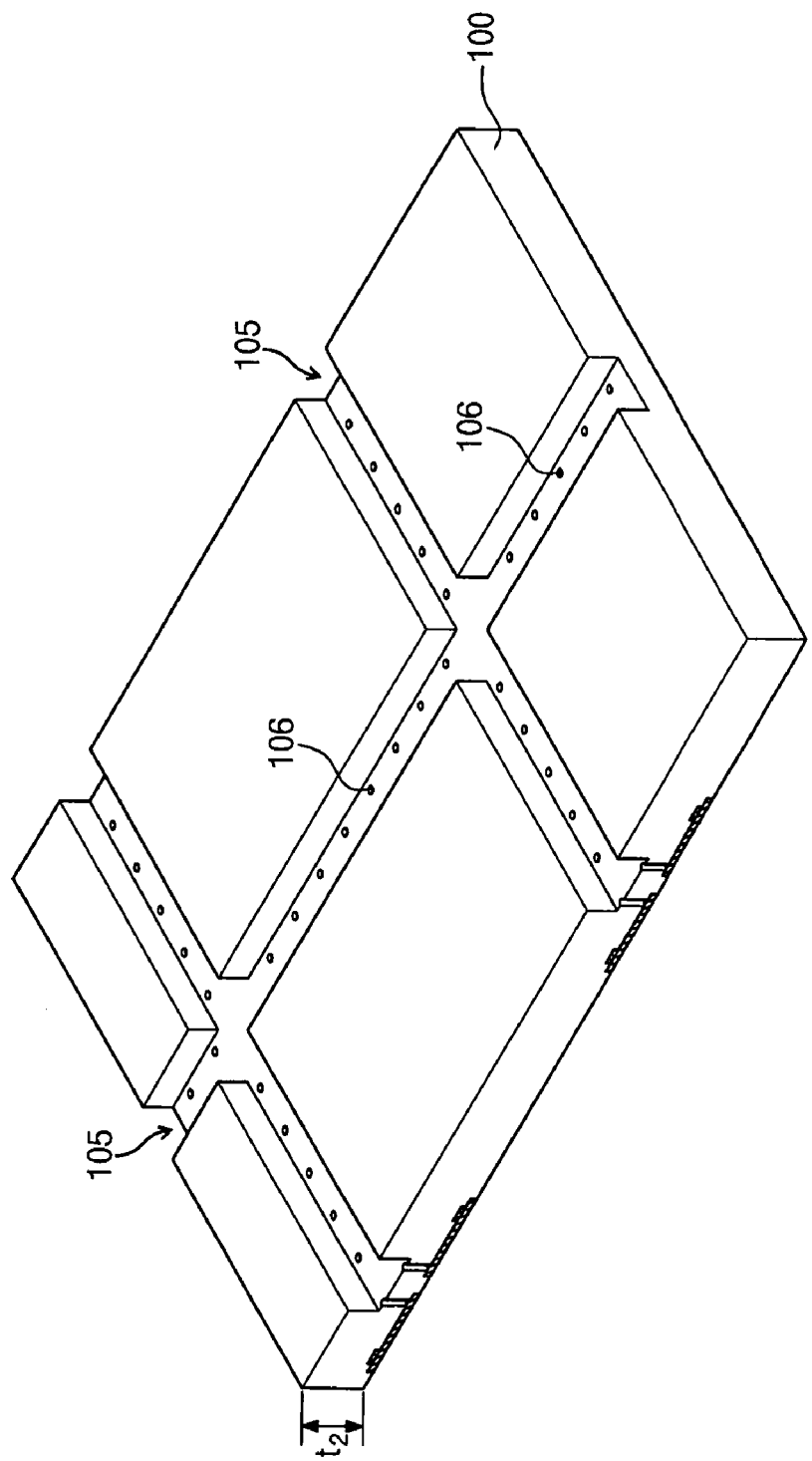

Referring to FIG. 2A, FIG. 6A and FIG. 6B, a via hole 106 penetrating the wafer 100 is formed on the bottom surface of the trench 105(S50). The via hole 106 is formed in the connection region R2 (in other words, at the edge of the semiconductor chip). Also, the via hole 106 is formed to expose a bottom surface of the redistribution structure 130 (more specifically, the connecting pad).

The process of forming the via hole 106 may include patterning the wafer 100. The via hole 106 may be formed under the connecting pad by using a laser drilling technique. According to another embodiment of the present invention, the via hole 106 may be formed by using a conventional patterning method including photolithography and etch processes. In this case, the etch process may be performed by using an etch recipe having etch selectivity towards the connecting pad (i.e. the redistribution structure 130). In other words, the redistribution structure 130 is made of a metallic material, the wafer 100 is made of silicon, and an insulation layer such as silicon oxide and silicon nitride (a part of the semiconductor chip) is disposed between the wafer 100 and the redistribution structure 130. Therefore, an etch recipe having etch selectivity towards the metallic material is used to perform the etch process of forming the via hole 106. This etch process of forming the via hole 106 includes etching the silicon, the silicon oxide and the silicon nitride using the etch recipe.

According to another exemplary embodiment of the invention, the wafer 100 is patterned by using the laser drilling technique. Therefore, forming a preliminary via hole under the connecting pad and completing the via hole by extending the preliminary via hole may be included. In order to extend the preliminary via hole, a method of etching the backside of the wafer may be utilized.

According to an exemplary embodiment of the invention, as described above, the redistribution structure 130 may be formed by electroplating using a seed layer. In such case, the via hole 106 is formed to expose the bottom surface of the seed layer.

Figure 7A:
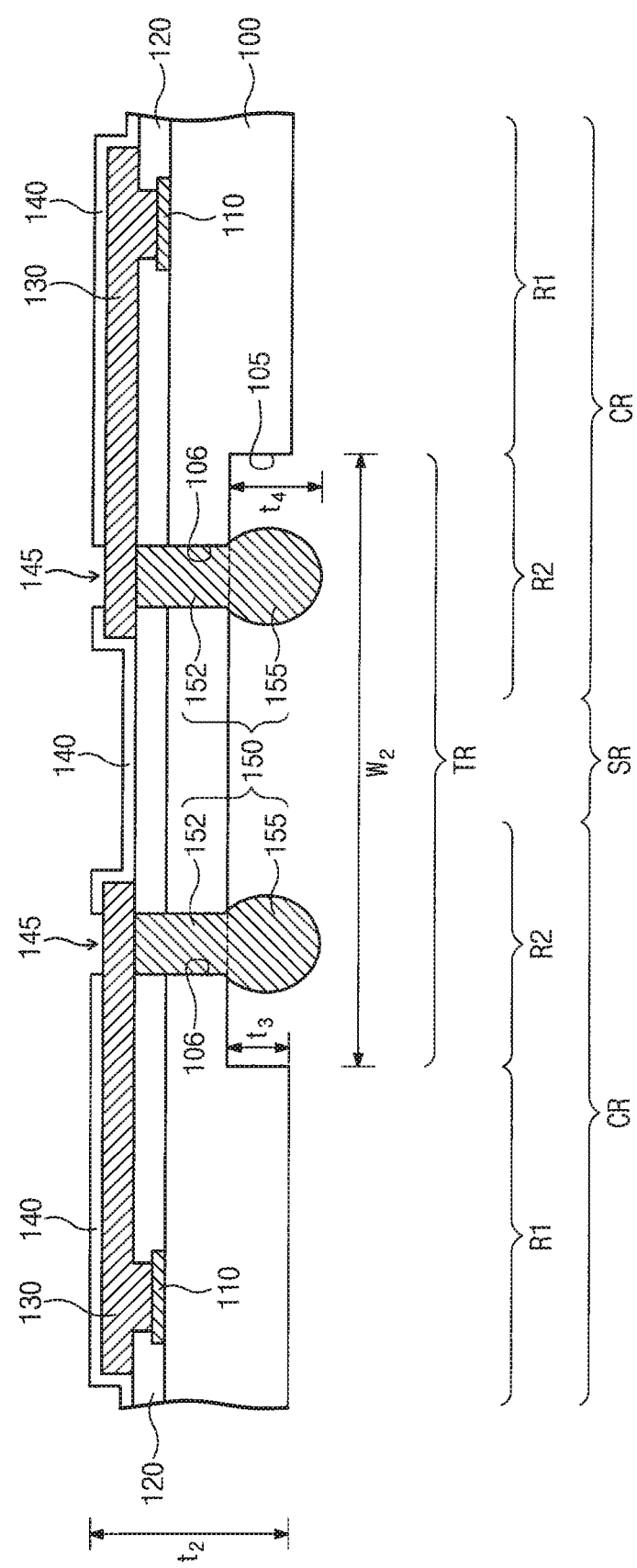
Figure 7B:
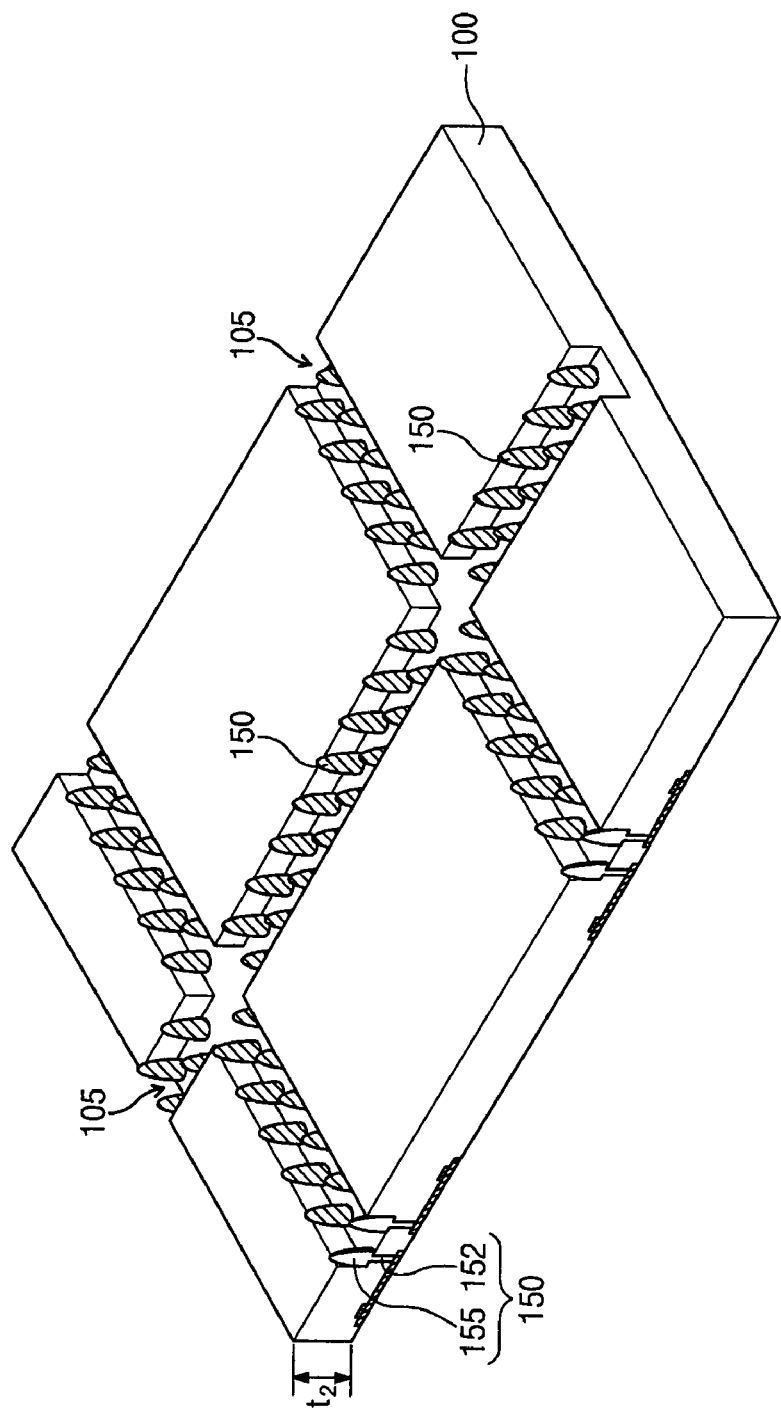

Referring to FIG. 2A, FIG. 7A and FIG. 7B, a connecting device 150 is formed to be connected to the redistribution structure 130 through the via hole 106 (S60). The connecting device 150 includes a connecting plug 152 filling the via hole 106 and a bump 155 disposed on a bottom portion of the connecting plug 152. As a result, the connecting device 150 is disposed at the connection region R2 as shown in FIG. 7A.

Forming the connecting device 150 is performed by using one of electroplating, solder jet, screen printing or C4NP (Controlled Collapse Chip Connection New Process). For example, the connecting plug 152 may be formed using electroplating which uses the redistribution structure 130 (especially, the seed layer) as a seed electrode. Also, the bump 155 may be formed using one or more of a solder jet process, a screen printing process and C4NP.

In order to improve adhesion between the connecting device 150 and the redistribution structure 130, a UBM layer (not shown) covering a bottom surface of the via hole 106 may be further formed before forming the connecting plug 152. The UBM layer may be made of one or more chosen from nickel(Ni), chrome(Cr), copper(Cu), tungsten titanium (TiW) and gold(Au).

Also, considering that the bump 155 functions as an electrically connecting path to other semiconductor chips, the bump 155 is formed so that it may have a larger thickness $t_4$ than the depth $t_3$ of the trench 105. In other words, the thickness $t_4$ of the bump 155 is larger than the difference in thickness between the central region R1 and the connection region R2.

Figure 8:
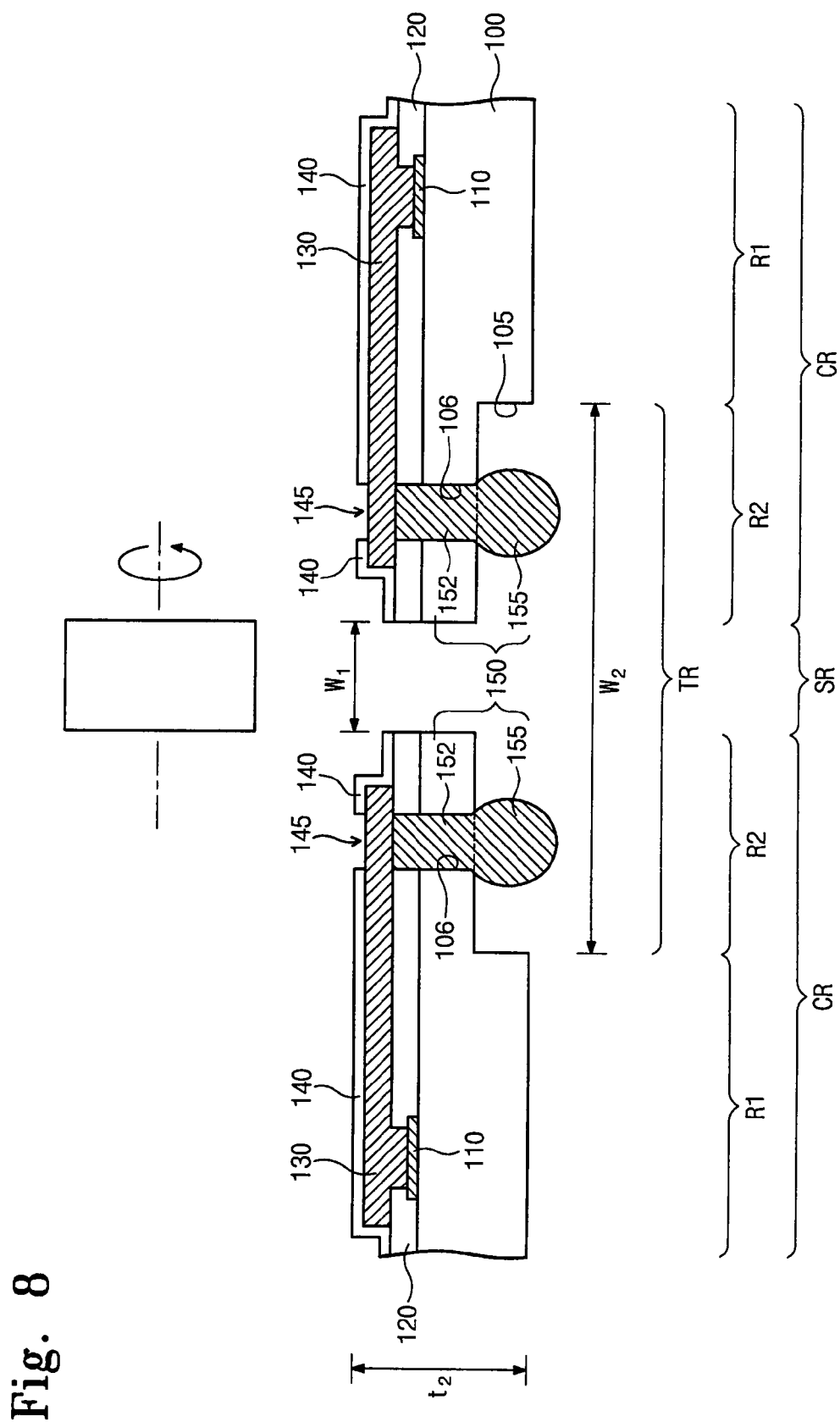

Referring to FIG. 2A and FIG. 8, a sawing process is performed on the resultant structure where the connecting device 150 is mounted to separate each semiconductor chip (S70). The sawing process includes cutting the wafer 100 along the scribe lane region SR.

According to an embodiment of the present invention, in order to prevent the connecting device 150 (especially, the bump) from being physically damaged, forming a buffer layer filling the trench 105 may be further performed before performing the sawing process. Considering the fact that the function of the bump is to electrically connect components, the buffer layer is formed to expose the bottom region of the bump 155.

Figure 9:
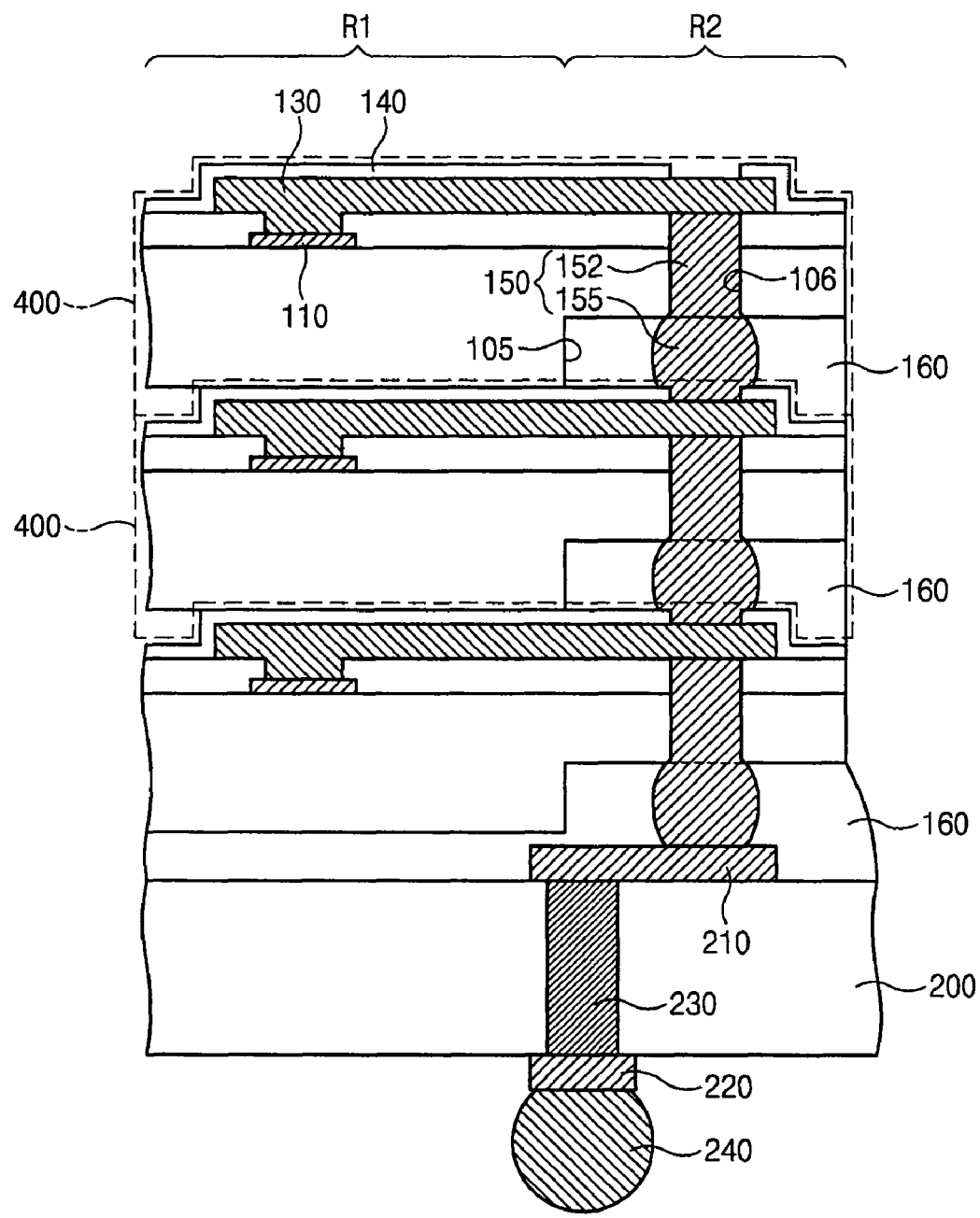

Referring to FIG. 9, the redistribution structure 130 and the connecting device 150 are disposed on the separated semiconductor chip. The semiconductor chip constitutes a package unit 400, several of which construct a wafer level package of the invention. In some embodiments of the invention, the package units 400 may be connected to each other through the connecting pad (portion of redistribution structure 130 exposed by the via hole 106 and the opening 145) and the connecting device 150. While being connected, the package units 400 are stacked sequentially on an interconnection substrate 200 having a connection terminal 210. More specifically, a bump 155 of one package unit 400 is connected directly to the top surface of the connecting pad of another package unit 400 or on a connection terminal 210 of the interconnection substrate 200. The interconnection substrate 200 may have an external bump 240 connected to an external electronic device and an interconnection 230 and a pad 220 connecting the connection terminal 210 and the external bump 240.

According to this invention, a protection layer 160 may be interposed between the package units 400, in order to prevent the package units 400 from sticking to each other and to prevent physical damage to the bump 155. In an embodiment of the invention, the above-mentioned buffer layer may be utilized as the protection layer 160. The protection layer 160 may be formed by injecting insulative material such as epoxy, in between the package units 400.

Figure 2B:
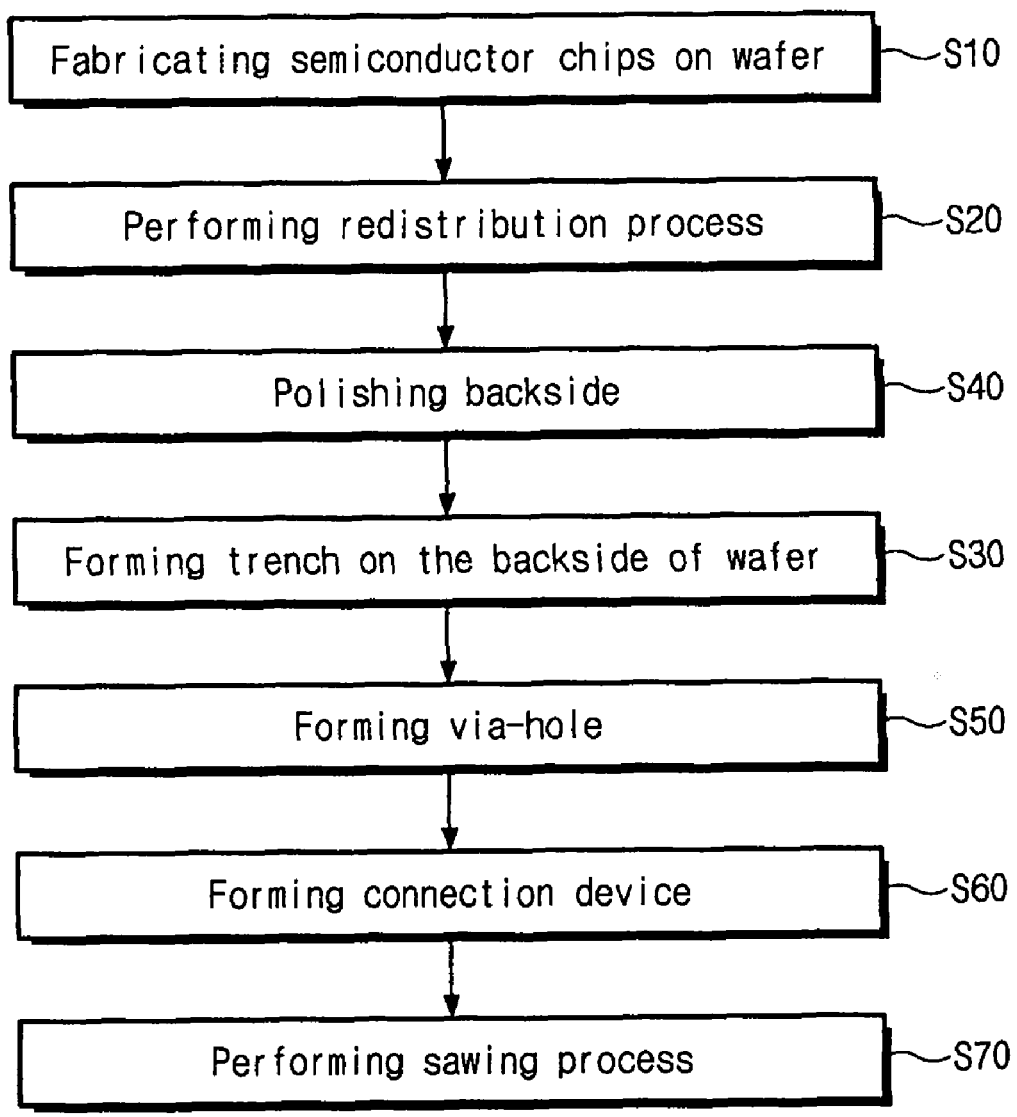

FIG. 2B illustrates a process flow chart of a method of manufacturing a wafer level package according to another embodiment of the present invention.

Referring to FIG. 2B, according to this embodiment, the trench 105 and the via hole 106 are formed after the backside polishing process (S40) is performed. As a result, this embodiment is similar to the exemplary embodiment formerly described referring to FIG. 2A, except for this difference in the process order.

In the case where the backside of the wafer 100 is polished before forming the trench 105, it is possible to prevent the above described physical damage to the trench 105 caused by the backside polishing process. Also, the thickness of the wafer 100 is decreased as a result of this backside polishing process before the trench 105 is formed. Thus, it is possible to decrease the thickness to be etched during the trench forming process. As is well-known in the art, increases in etch thickness causes more process error in the etch process. Consequently, following the process order of this embodiment enables control of the wafer thickness at the trench 105 and the depth of the via hole 106 more accurately.

Figure 10:
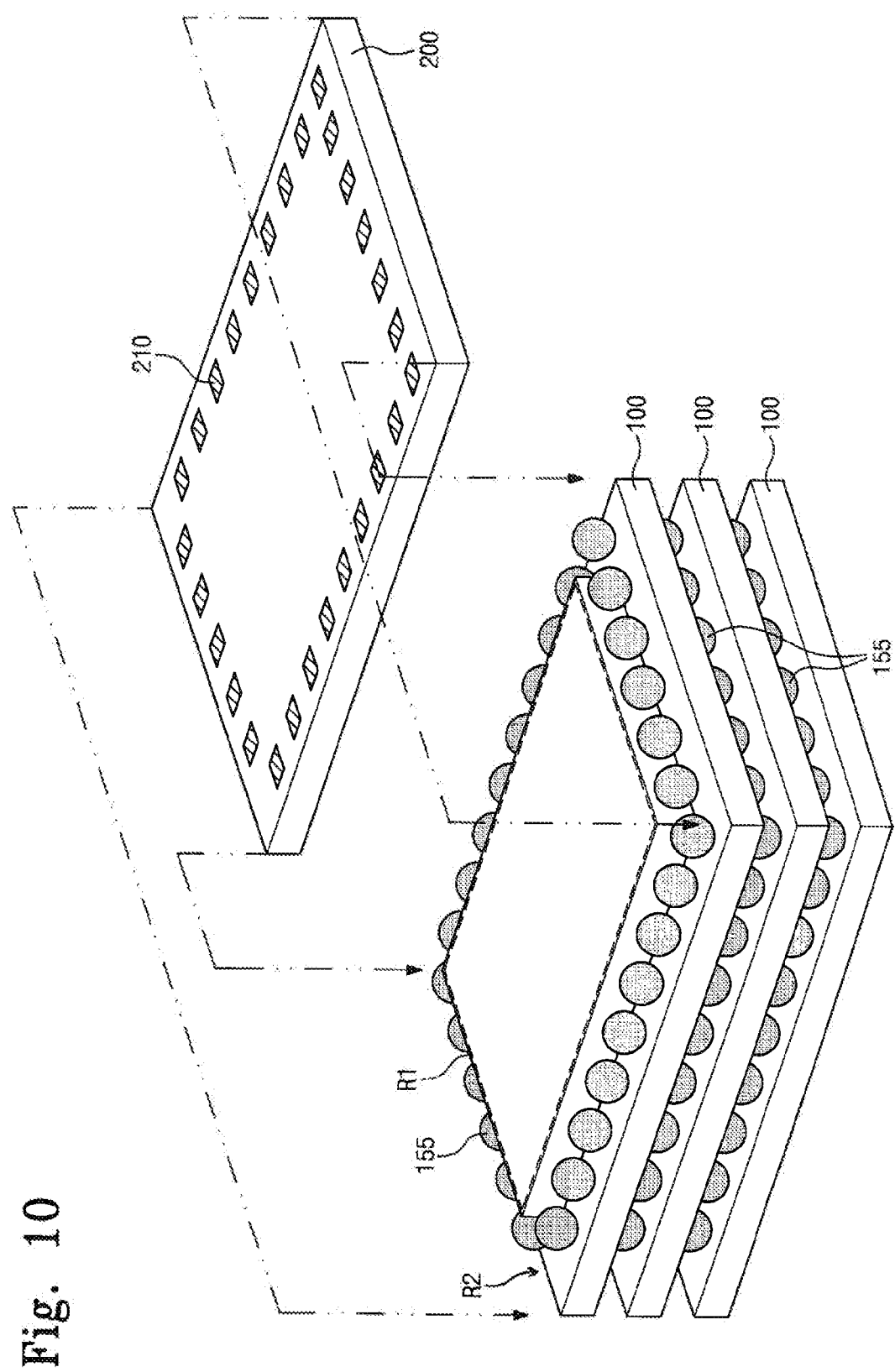
FIG. 10 is a perspective view illustrating a wafer level package according to embodiments of the present invention.

FIG. 10 illustrates a perspective view of a wafer level package of the present invention.

Referring to FIG. 9 and FIG. 10, the wafer level package of this invention includes a plurality of package units 400 stacked sequentially. The package units 400 may include a semiconductor substrate 100 where semiconductor chips are built and a connecting terminal or connecting device 150 electrically connected to the semiconductor chip. These stacked package units 400 are adhered to the interconnection substrate 200 having the connection terminal 210.

More specifically, the semiconductor chip may include an internal circuit formed at the semiconductor substrate 100, a redistribution structure 130, and an input/output pad 110 connecting to the redistribution structure 130. Here, the semiconductor substrate 100 may be divided into a central region R1 where the internal circuits of the semiconductor chip are disposed and a connection region R2 disposed at the exterior of the central region R1. According to this invention, the connection region R2 has a smaller thickness than the central region R1. Accordingly, in the connection region R2, as shown in FIG. 9, a trench 105 defined by a sidewall of the central region R1 is formed.

The connecting device 150 is formed to penetrate the semiconductor substrate 100 at the connection region R2. In order to do this, the connecting device 150 includes a connecting plug 152 filling the via hole 106 penetrating the semiconductor substrate 100 and a bump 155 formed within the trench 105 while being connected to the connecting plug 152. According to some embodiments of the present invention, the height of the bump 155 may be larger than the depth (i.e. the difference in thickness between the central region R1 and the connection region R2) of the trench 105.

According to an exemplary embodiment, the connecting device 150 is electrically connected to the input/output pad 110 through a redistribution structure 130 which is disposed on the semiconductor substrate 100. The redistribution structure 130 includes a connecting pad which is disposed in the connection region R2 to be connected to the connecting device 150. A UBM layer (not shown) may be interposed between the connecting pad and the connecting plug 152. Also, as shown in FIG. 9, a protection layer 160 surrounding the bump 155 may be further interposed between the package units 400.

According to an exemplary embodiment of the present invention, a trench is formed along a scribe lane region. Then, a connecting terminal penetrating the bottom surface of the trench is formed. Therefore, stress due to an overly protruded connecting terminal and its resulting decrease in connection reliability may be minimized. Also, as the connecting terminal is formed in the trench, it is possible to decrease the thickness of the entire package. Further, since the trench is formed before the via hole, the depth of the via hole can be reduced, thereby reducing the fabrication costs of the wafer level package of the present invention compared to conventional methods.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A wafer level package, comprising:
   an interconnection substrate; and
   one or more semiconductor chips stacked on the interconnection substrate, wherein at least one of the semiconductor chips comprises:
   a central region for an internal circuit and a connection region disposed adjacent to the central region;
   a redistribution structure connected to the internal circuit on the semiconductor chip, the redistribution structure comprising a connection pad disposed on the connection region; and
   a connecting device in the connection region, the connecting device penetrating through the semiconductor chip and connected to the connection pad,
   wherein the thickness of the connection region is smaller than the thickness of the central region.

2. The wafer level package of claim 1, wherein the at least one of the semiconductor chips further comprises a semiconductor substrate, the internal circuit disposed on the semiconductor substrate, an interconnection structure connected to the internal circuit, and an input/output pad connected to the interconnection structure,
   wherein the connecting device comprises a connection plug penetrating the semiconductor chip and a bump disposed under the connection region to be connected to the connection plug.

3. The wafer level package of claim 2, wherein the thickness of the bump is larger than the difference in thickness between the central region and the connection region.

4. The wafer level package of claim 2, further comprising:
   an under-bump metallization (UBM) layer interposed between the connection plug and the connection pad.

5. The wafer level package of claim 4, wherein the UBM layer comprises one or more of nickel(Ni), chrome(Cr), copper(Cu), tungsten titanium(TiW) and gold(Au).

6. The wafer level package of claim 2, wherein the semiconductor chips are electrically connected to each other through the bump of a semiconductor chip and the connection pad of another semiconductor chip.

7. The wafer level package of claim 6, further comprising:
   a protection layer disposed between the semiconductor chips, the protection layer enclosing the bump.

8. The wafer level package of claim 2, wherein the bump of the at least one of semiconductor chips contacts a connection terminal on the interconnection substrate, thereby electrically connecting the at least one of semiconductor chips to the interconnection substrate.

9. The wafer level package of claim 8, further comprising a protection layer disposed between the at least one of semiconductor chips and the interconnection substrate, the protection layer enclosing the bump.

* * * * *